(12) United States Patent
Rausch (10) Patent No.: US 7,532,053 B2
(45) Date of Patent: *May 12, 2009

(54) PHASE INTERPOLATION APPARATUS, SYSTEMS, AND METHODS

(75) Inventor: Gregory Jason Rausch, Plymouth, MN (US)

(73) Assignee: Micron Technology, Inc., Boise, ID (US)

( * ) Notice: Subject to any disclaimer, the term of this patent is extended or adjusted under 35 U.S.C. 154(b) by 134 days.

This patent is subject to a terminal disclaimer.

(21) Appl. No.: 11/649,434

(22) Filed: Jan. 4, 2007

(65) Prior Publication Data

US 2008/0164930 A1 Jul. 10, 2008

Related U.S. Application Data

(63) Continuation of application No. 11/649,435, filed on Jan. 4, 2007, now Pat. No. 7,443,219.

(51) Int. Cl.
*H03H 11/16* (2006.01)
(52) U.S. Cl. .................. 327/231; 327/235; 708/290
(58) Field of Classification Search .......... 327/231, 327/234–235, 245, 247–249; 708/290, 847; 375/273, 279, 280
See application file for complete search history.

(56) References Cited

U.S. PATENT DOCUMENTS

| 4,686,688 | A | * | 8/1987 | Chung et al. ............. 375/274 |
| 5,541,961 | A | * | 7/1996 | Farrow .................... 375/371 |
| 2008/0164928 | A1 | | 7/2008 | Rausch | |

* cited by examiner

*Primary Examiner*—An T Luu
(74) *Attorney, Agent, or Firm*—Schwegman, Lundberg & Woessner, P.A.

(57) ABSTRACT

A phase interpolator circuit may comprise a multiplexer circuit (MUX) to receive a plurality of clock signals at MUX inputs and to output a first clock signal and a second clock signal that are out of phase with each other, a digital to analog converter circuit (DAC) to convert a digital input to first and second DAC output currents such that a sum of the first and second DAC output currents comprises a substantially constant current value, and a weighted averager circuit coupled to the MUX and the DAC. The weighted averager circuit may operate to sum weighted first and second clock signals and to output a phase interpolated clock signal. The first clock signal may be weighted according to the first DAC output current and the second clock signal may be weighted according to the second DAC output current. Other apparatus, systems, and methods are disclosed.

24 Claims, 10 Drawing Sheets

| MUX SELECT BITS | | | DAC INPUTS | | | PHASE PLACEMENT (THEORETICAL) |
| --- | --- | --- | --- | --- | --- | --- |
| S2 | S1 | S0 | D2 | D1 | D0 | |
| 0 | 0 | 0 | 0 | 0 | 0 | 0 |
| 0 | 0 | 0 | 0 | 0 | 1 | 6.43 |
| 0 | 0 | 0 | 0 | 1 | 0 | 12.86 |
| 0 | 0 | 0 | 0 | 1 | 1 | 19.29 |
| 0 | 0 | 0 | 1 | 0 | 0 | 25.72 |
| 0 | 0 | 0 | 1 | 0 | 1 | 32.15 |
| 0 | 0 | 0 | 1 | 1 | 0 | 38.58 |
| 0 | 0 | 0 | 1 | 1 | 1 | 45 |
| 0 | 0 | 1 | 1 | 1 | 1 | 45 |
| 0 | 0 | 1 | 1 | 1 | 0 | 51.43 |
| 0 | 0 | 1 | 1 | 0 | 1 | 57.86 |
| 0 | 0 | 1 | 1 | 0 | 0 | 64.29 |
| 0 | 0 | 1 | 0 | 1 | 1 | 70.72 |
| 0 | 0 | 1 | 0 | 1 | 0 | 77.15 |
| 0 | 0 | 1 | 0 | 0 | 1 | 83.58 |
| 0 | 0 | 1 | 0 | 0 | 0 | 90 |
| 0 | 1 | 0 | 0 | 0 | 0 | 90 |
| 0 | 1 | 0 | 0 | 0 | 1 | 96.43 |
| 0 | 1 | 0 | 0 | 1 | 0 | 102.86 |
| 0 | 1 | 0 | 0 | 1 | 1 | 109.29 |
| 0 | 1 | 0 | 1 | 0 | 0 | 115.72 |
| 0 | 1 | 0 | 1 | 0 | 1 | 122.15 |
| 0 | 1 | 0 | 1 | 1 | 0 | 128.58 |
| 0 | 1 | 0 | 1 | 1 | 1 | 135 |
| 0 | 1 | 1 | 1 | 1 | 1 | 135 |
| 0 | 1 | 1 | 1 | 1 | 0 | 141.43 |
| 0 | 1 | 1 | 1 | 0 | 1 | 147.86 |
| 0 | 1 | 1 | 1 | 0 | 0 | 154.29 |
| 0 | 1 | 1 | 0 | 1 | 1 | 160.72 |
| 0 | 1 | 1 | 0 | 1 | 0 | 167.15 |
| 0 | 1 | 1 | 0 | 0 | 1 | 173.58 |
| 0 | 1 | 1 | 0 | 0 | 0 | 180 |

| MUX SELECT BITS | | | DAC INPUTS | | | PHASE PLACEMENT |
| --- | --- | --- | --- | --- | --- | --- |
| S2 | S1 | S0 | D2 | D1 | D0 | (SOLUTION) |
| 0 | 0 | 0 | 0 | 0 | 0 | 2.81 |
| 0 | 0 | 0 | 0 | 0 | 1 | 8.43 |
| 0 | 0 | 0 | 0 | 1 | 0 | 14.05 |
| 0 | 0 | 0 | 0 | 1 | 1 | 19.67 |
| 0 | 0 | 0 | 1 | 0 | 0 | 25.29 |
| 0 | 0 | 0 | 1 | 0 | 1 | 30.91 |
| 0 | 0 | 0 | 1 | 1 | 0 | 36.53 |
| 0 | 0 | 0 | 1 | 1 | 1 | 42.15 |
| 0 | 0 | 1 | 1 | 1 | 1 | 47.77 |
| 0 | 0 | 1 | 1 | 1 | 0 | 53.39 |
| 0 | 0 | 1 | 1 | 0 | 1 | 59.01 |
| 0 | 0 | 1 | 1 | 0 | 0 | 64.63 |
| 0 | 0 | 1 | 0 | 1 | 1 | 70.25 |
| 0 | 0 | 1 | 0 | 1 | 0 | 75.87 |
| 0 | 0 | 1 | 0 | 0 | 1 | 81.49 |
| 0 | 0 | 1 | 0 | 0 | 0 | 87.11 |
| 0 | 1 | 0 | 0 | 0 | 0 | 92.73 |
| 0 | 1 | 0 | 0 | 0 | 1 | 98.35 |
| 0 | 1 | 0 | 0 | 1 | 0 | 103.97 |
| 0 | 1 | 0 | 0 | 1 | 1 | 109.59 |
| 0 | 1 | 0 | 1 | 0 | 0 | 115.21 |
| 0 | 1 | 0 | 1 | 0 | 1 | 120.83 |
| 0 | 1 | 0 | 1 | 1 | 0 | 126.45 |
| 0 | 1 | 0 | 1 | 1 | 1 | 132.07 |
| 0 | 1 | 1 | 1 | 1 | 1 | 137.69 |
| 0 | 1 | 1 | 1 | 1 | 0 | 143.31 |
| 0 | 1 | 1 | 1 | 0 | 1 | 148.93 |
| 0 | 1 | 1 | 1 | 0 | 0 | 154.55 |
| 0 | 1 | 1 | 0 | 1 | 1 | 160.17 |
| 0 | 1 | 1 | 0 | 1 | 0 | 165.79 |
| 0 | 1 | 1 | 0 | 0 | 1 | 171.41 |
| 0 | 1 | 1 | 0 | 0 | 0 | 177.03 |

PHASE INTERPOLATION APPARATUS, SYSTEMS, AND METHODS

This Application is a continuation of the U.S. patent application Ser. No. 11/649,435, filed on Jan. 4, 2007, now U.S. Pat. No. 7,443,219.

TECHNICAL FIELD

The field generally relates to electronic circuits, including phase interpolator circuits.

BACKGROUND

A phase interpolator circuit can be used to provide a set of clock signals. The clock signals each include a phase that may be offset with respect to the other clock signals. The plurality of phase offset clock signals are useful to provide one or more clock signals having a clock edge in a desired relationship to another signal, typically a data signal. For example, in some applications data is sent between two integrated circuits that don't share a common clock. A phase interpolator circuit can be used to provide multiple clocks on a receiving integrated circuit, one of which is selected as an internal clock for data sampling. In another example, the clock signals may be automatically successively switched onto another circuit, i.e., to sweep the clock phases. This can provide timing measurements with increased resolution that are useful for high speed circuit testing. In many cases, it is desired that the clock phase sweeping operation be substantially error-free.

DETAILED DESCRIPTION

To meet the challenges described above, some embodiments may operate to receive clock signals at multiplexer (MUX) inputs and to output clock signals that are out of phase with each other. A digital to analog converter (DAC) may be used to convert a digital input to first and second DAC output currents such that their sum comprises a substantially constant current value. A weighted averager circuit, coupled to the MUX and the DAC, may sum weighted first and second clock signals to output a phase interpolated clock signal. The first clock signal may be weighted according to the first DAC output current, and the second clock signal may be weighted according to the second DAC output current. The phase of the interpolated clock signal may be swept by changing the weighting of the first and second clock signals.

Figure 1:
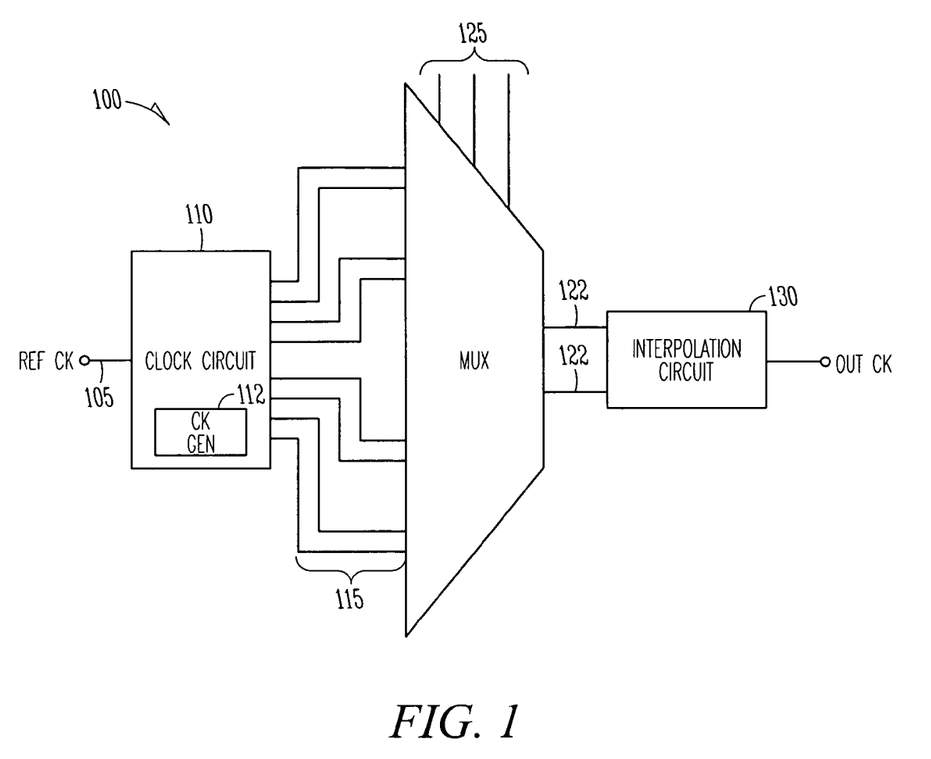
FIG. 1 is a block diagram of portions of a system to generate clocks having phases different from a reference clock signal, according to various embodiments of the invention.

FIG. 1 is a block diagram of portions of a system to generate clocks having phases different from a reference clock signal. Here it can be seen that a reference clock signal 105 may be provided to a clock circuit 110 to produce a set of reference phase clock signals 115. The reference phase clock signals 115 may include phases evenly spaced across 360° of phase. In some embodiments, the clock circuit 110 includes a clock generator 112, such as a phase locked loop (PLL), to generate the reference phases of the clock signals 115, and in some embodiments, the clock generator 112 includes a delay locked loop (DLL). The reference phase clock signals 115 may then be provided to a multiplexer circuit or MUX 120, which includes circuitry for selecting one or more pairs of clock signals (i.e., selected clock signals 122) according to MUX select bits 125. The system 100 includes an interpolation circuit 130 that interpolates between the phases of the selected clock signals 122 to provide output clock signals OUTCK having different phases.

Figure 2:
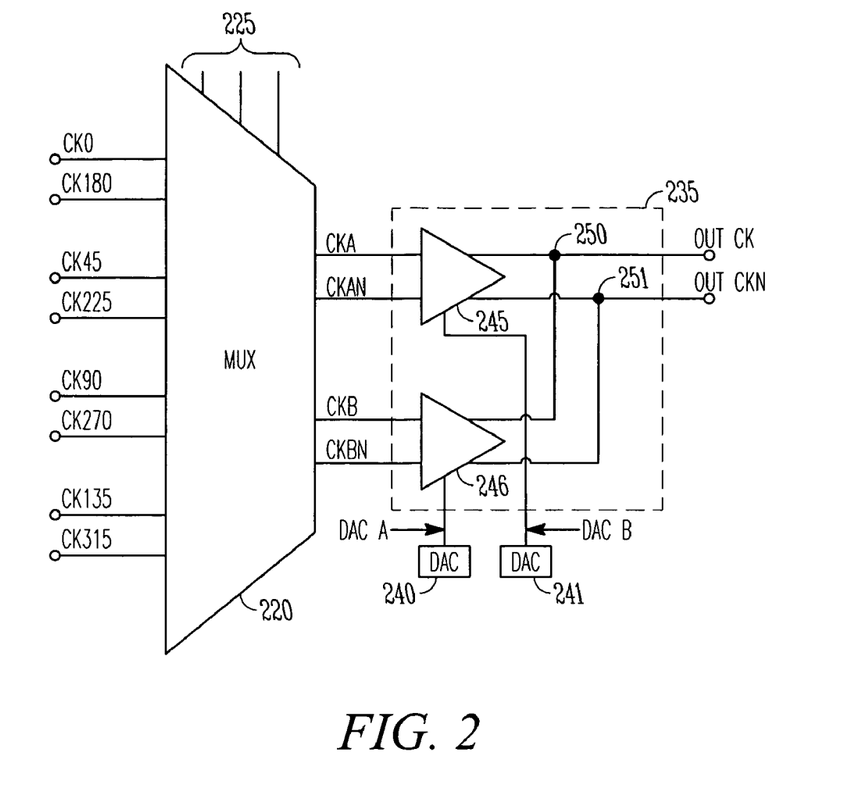
FIG. 2 is a block diagram of portions of a phase interpolator circuit, according to various embodiments of the invention.

FIG. 2 shows a block diagram of portions of a phase interpolator circuit 200. A set of eight reference phase clock signals CK0, CK180, CK45, CK225, CK90, CK270, CK135, and CK 315 are input into a MUX 220. A pair of reference clock signals CKA, CKB and their inverse clock signals CKAN, CKBN are output from the MUX 220. Note that the reference phase clock signal with 180° phase is an inverse of the clock signal with 0° phase and vice versa. Thus, in one pair (i.e., CK0, CK180) the clock signal has a phase of 0° and the inverse has a phase of 180°, and in another pair (i.e., CK180, CK0), the clock signal has a phase of 180° and the inverse is 0°.

A weighted averager circuit 235 receives the reference clock signals CKA, CKB and their inverse clock signals CKAN, CKBN from the MUX 220 and may provide them to two differential buffers 245, 246. The outputs of the differential buffers 245, 246 may then be combined at summing nodes 250, 251 to produce an output clock OUTCK with a phase interpolated between the pair of clock signals CKA, CKB.

The phase interpolator circuit 200 may include two DACs 240, 241, which may operate to convert a digital input signal into an analog electrical signal (i.e., a current or a voltage). Here, the DACs 240, 241 each convert a digital input signal into a current used to weight the outputs of the differential buffers 245, 246. In some embodiments, the DACs 240, 241 bias the output drive of the differential buffers 245, 246 by sinking current. To sweep the phase of the output clock signal OUTCK, the digital input to the DACs 240, 241 and the select bits 225 of the MUX are changed to create different weighted combinations of the clock signals CKA, CKB. Sources of error in creating the output clock OUTCK with interpolated phase include phase shrinkage and integral nonlinearity error (INL) as the MUX select bits 225 are changed. Phase shrinkage may be manifested near a MUX boundary, such as where the MUX 220 selects a new clock pair.

Figure 3:
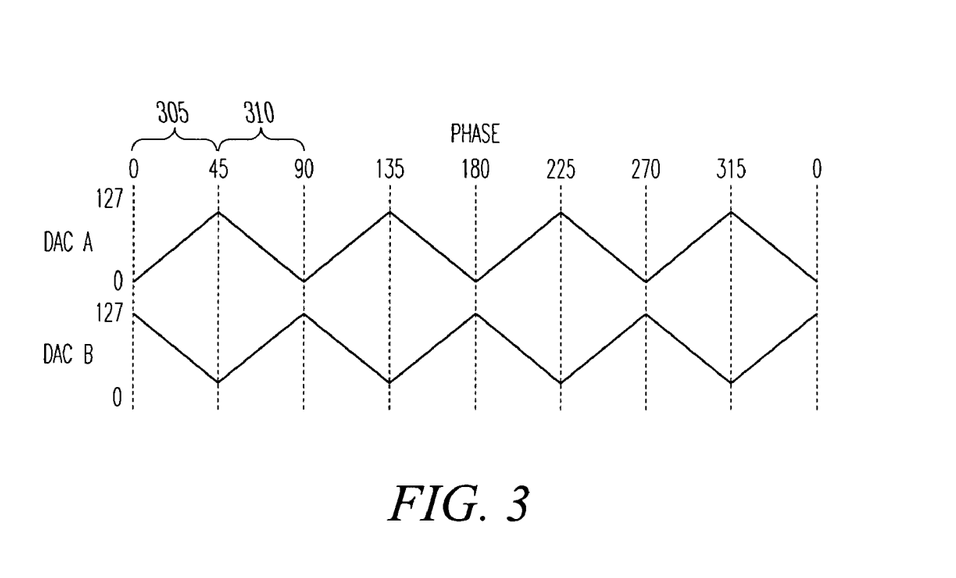
FIG. 3 illustrates eight reference phase clock signals used to sweep an output clock phase through 360°, according to various embodiments of the invention.

FIG. 3 illustrates eight reference phase clock signals used to sweep an output clock phase through 360°. The eight reference phase clock signals have phases spaced at 0°, 45°, 90°, 135°, 180°, 225°, 270°, and 315°, respectively. As shown, two of the reference phase clock signals that are forty-five degrees out of phase are combined along with their inverse signals to sweep the phase of the output clock signal OUTCK through each forty-five degree phase segment. Thus, reference phase clock signals CK0, CK45 having phase shifts of 0° and 45° are combined in the first segment 305, reference phase clock signals CK45, CK90 having phases of 45° and 90° are combined in the second segment 310, and so on.

The two DAC output signals, DAC A and DAC B, correspond to the output signals from DACs 240 and 241 respectively, as seen in FIG. 2. The DACs 240, 241 are used to weight the combination of the reference signals CKA, CKB to produce the output clock signal OUTCK. DAC A and DAC B may be current outputs provided to the output stage of the differential amplifiers 245, 246. Because the amount of current determines the strength of the output drive of the buffers, the relative magnitudes of the current drive can determine how much of the resulting phase is due the CKA or the CKB input.

In some embodiments, the DACs 240, 241 include seven-bit digital inputs that are decoded to $2^7$, or 128, levels of analog output numbered zero to 127. To create the 0° phase, the first reference phase clock signal CKA is weighted fully with DAC B using a DAC 241 count of 127 and the output of the first, or even, differential buffer 245 is on. The second reference signal CKB is given the least weight with DAC A using a DAC 240 count of 0 and the output of the second, or odd, differential buffer 246 is off. To sweep the phase, DAC 241 decrements to gradually turn off the output drive of the first differential buffer 245, and DAC 240 increments to gradually turn on the output of the second differential buffer output 246. When DAC 241 decrements to zero, the output of the first differential buffer 245 is turned off. The MUX select bits 225 are then changed to select the third reference phase clock signal CK90 that has a phase shift of 90°. CK90 is applied to the first differential buffer 245 which is still off. DAC 240 decrements, decreasing output DAC A, while DAC 241 increments, increasing output DAC B to gradually turn off the output of the second differential buffer 246 as the phase is swept from 45° to 90°.

Figure 4:
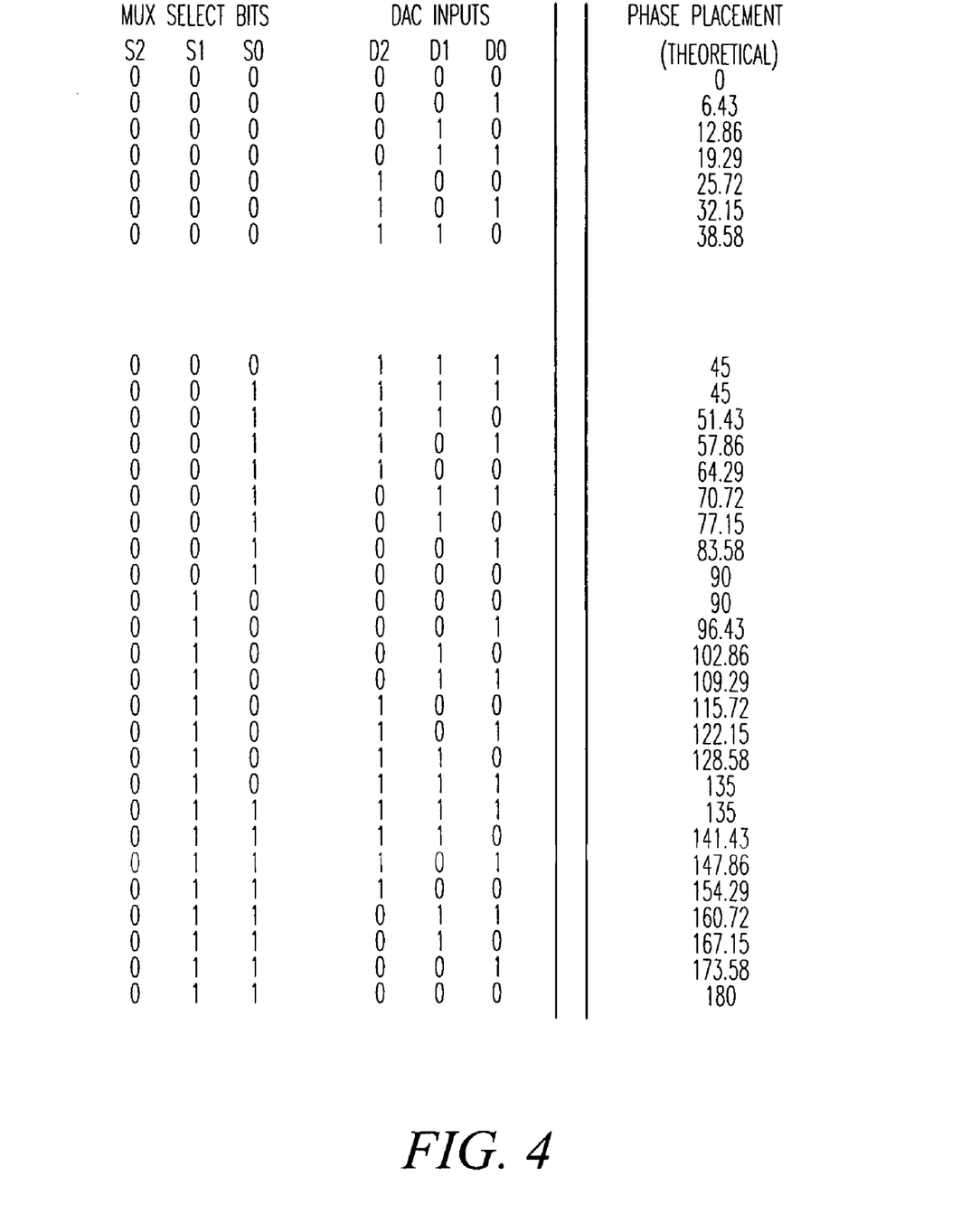
FIG. 4 is a table illustrating sweeping an output clock phase, according to various embodiments of the invention.

FIG. 4 is a table illustrating sweeping an output clock phase. For simplicity, only a three-bit digital input for eight steps of output from DAC A are shown, and only the digital input for DAC 240 is shown. It should be noted that, as shown in FIG. 3, output DAC A increases while output DAC B decreases. An extra long step is seen at 45° when the output drive of the first differential buffer 245 is turned off and the MUX select bits 225 change from "000" to "001" to select the third reference clock having a phase of 90°. The extra long step is primarily due to coupling capacitance between the outputs of the two differential buffers 245, 246. An extra long step occurs whenever the MUX select bits 225 are changed, which leads to phase shrinkage (e.g., at phase angles of 90° and 135° in FIG. 4).

Ideally, a DAC should have a transfer function that is a straight line. INL error in data converters such as DACs is a deviation from a straight line transfer function. Phase-to-Phase INL error manifests itself as a non-linear curve at the DAC output. The phase-to-phase change is not linear and INL error causes the change to appear parabolic, or perhaps as an S-curve.

Figure 5:
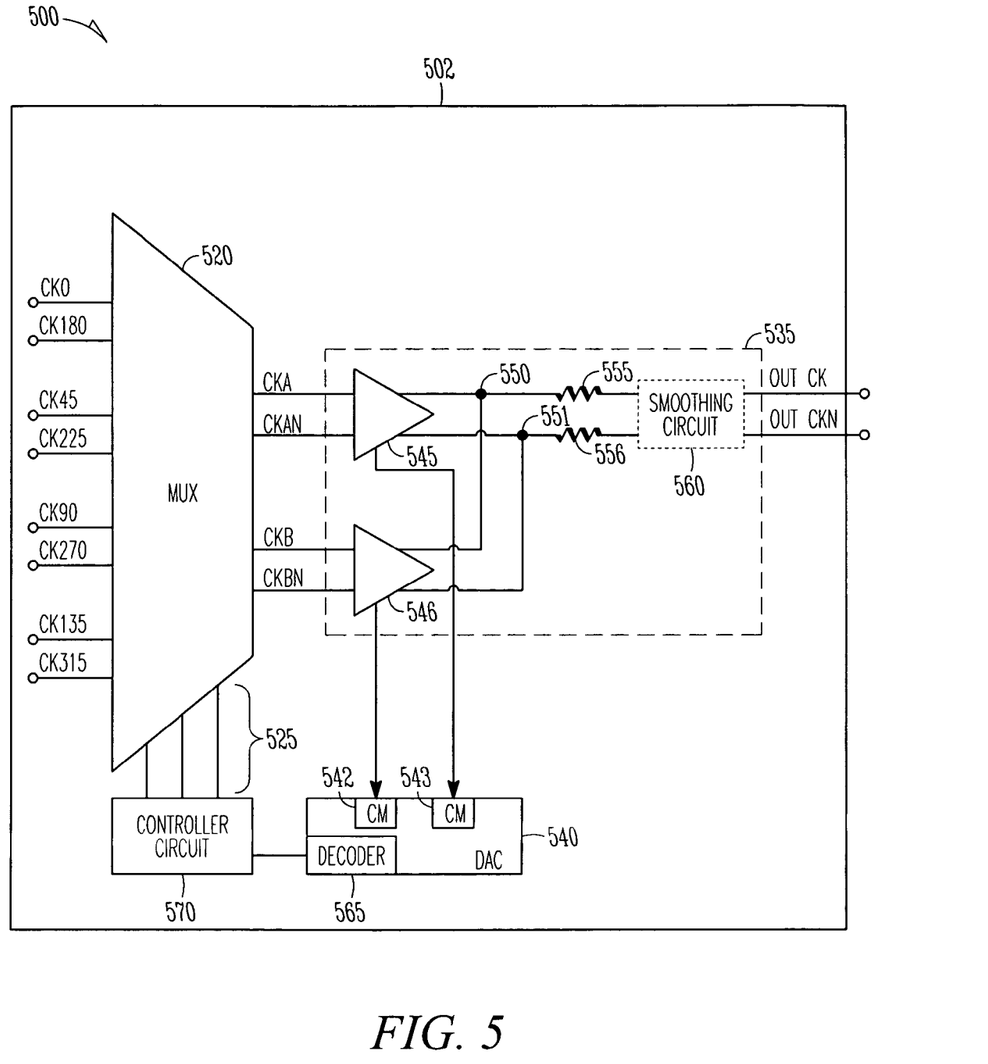
FIG. 5 is a block diagram of portions of a phase interpolator circuit, according to various embodiments of the invention.

FIG. 5 is a block diagram of portions of a phase interpolator circuit 500. A set of eight reference phase clock signals CK0, CK180, CK45, CK225, CK90, CK270, CK135, and CK315 are created from a reference clock using a clock circuit (not shown). The reference phase clock signals CK0, CK180, CK45, CK225, CK90, CK270, CK135, and CK315 are received by the MUX 520. The MUX 520 outputs a first clock signal CKA and a second clock signal CKB that are out of phase with each other. The MUX 520 also outputs the inverse clocks CKAN and CKBN. A weighted averager circuit 535 receives the clock signals CKA, CKAN, CKB, CKBN output from the MUX 520 into two differential buffers 545, 546. The outputs of the differential buffers 545, 546 are combined at summing nodes 550, 551 to produce an output clock OUTCK with a phase interpolated between the phases of the input pair of clock signals CKA, CKB. In some embodiments, the summing nodes 550, 551 are connected to output loads 555, 556 and a smoothing circuit 560. In some embodiments, the phase interpolator circuit 500 is included in an integrated circuit (IC) package 502.

The phase interpolator circuit 500 includes a single DAC 540. The DAC 540 decodes a single digital input to drive two current mirrors 542, 543 (CM) to provide two DAC output currents to bias the output drive of the differential buffers 545, 546. The DAC 540 may include a decoder 565 to decode the digital input to the DAC. In some embodiments, the first output current is determined according to a decoding of the digital input and the second output current is determined according to a complement of the decoding. As the first DAC output increases according to a change in the digital input provided by the controller circuit 570, the second DAC output current decreases. The sum of the two DAC output currents may then comprise a substantially constant value of current and the output phase may change according to the relative proportion of the currents. The first DAC output current is used to weight the first clock output signal CKA by adjusting an output drive of the first differential buffer 545. The second DAC output current is used to weight the second clock output signal CKB by adjusting an output drive of the second differential buffer 546.

The controller circuit 570 can be any logic circuit that can manipulate the digital input, such as a binary counter, a memory to store the input values, a processor, and the like. In some embodiments, a tri-state circuit is included in the output stage of the differential buffers 545, 546, such that the output of a differential buffer 545 can be tri-stated (i.e., set to a high impedance state) when the buffer 545 receives the lowest weighting DAC output current. In some embodiments, this can be when the output current turns the output of the buffer 545 off.

Figure 6A:
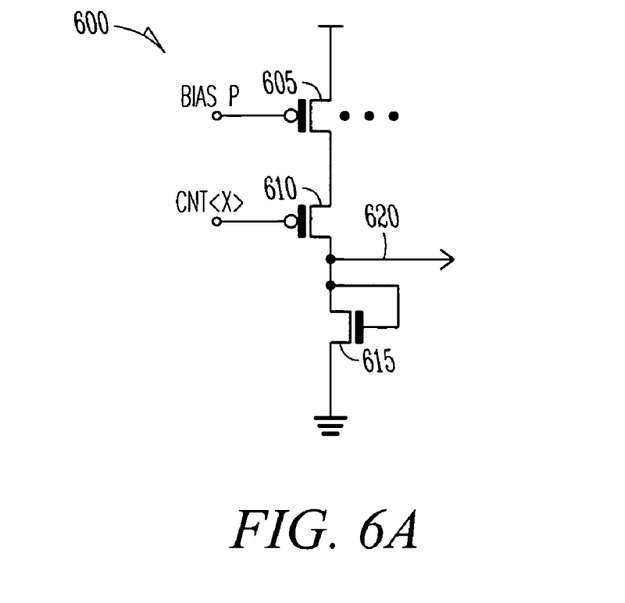
FIGS. 6A, 6B are schematic diagrams of DAC bit circuits, according to various embodiments of the invention.

FIG. 6A is a schematic diagram of a DAC bit circuit 600. The DAC bit circuit 600 may comprise a current mirror circuit enabled by a decoder. As shown, the gate of bias PMOS (p-type metal oxide semiconductor) transistor 605 is connected to a bias voltage BIAS P. The DAC bit circuit 600 also includes NMOS (n-type metal oxide semiconductor) transistor 615 and a control PMOS transistor 610 connected to a decoded count signal CNT<X>. If the DAC decodes 7 inputs to 128 bits, X is a number from 0 to 127 and the DAC includes 128 DAC bit circuits 600. The size of the current provided in each DAC bit circuit 600 is determined by the size of the bias PMOS transistor 605 and the gate bias BIAS P. When the control PMOS transistor 610 is on, current is sunk by NMOS transistor 615. To form a current mirror, another NMOS transistor (not shown) may have its gate connected to the gate of NMOS transistor 615. Because the gates of the two transistors have the same gate voltage, the current sunk by the current mirror is the same as that provided by all the DAC bit circuits 600 that have the control PMOS transistor 610 on.

In the embodiment shown in FIG. 2, for example, there might be a set of DAC bit circuits for DAC A and a set for DAC B. The DAC bit circuit 600 in FIG. 6A may be susceptible to current leakage because some of the control transistors 610 and current mirrors may be turned off.

Figure 6B:
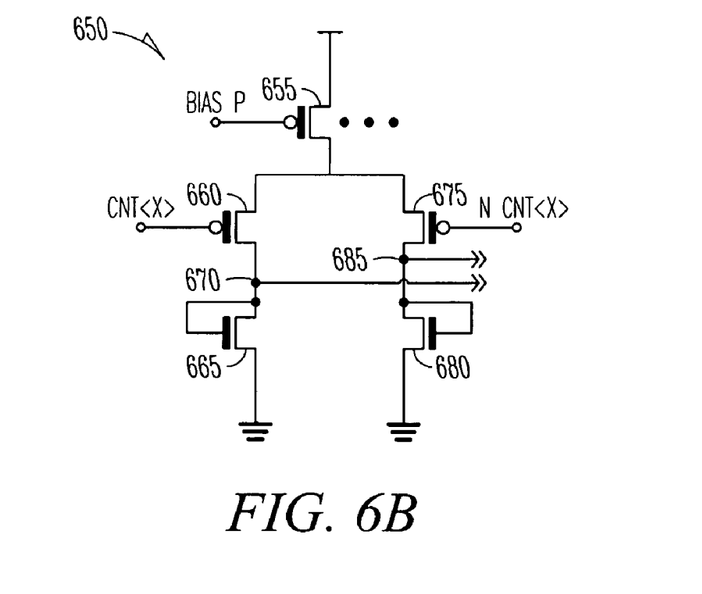

FIG. 6B is also a schematic diagram of a DAC bit circuit 650. The DAC bit circuit 650 may include a bias PMOS transistor 655 having a source connected to a supply voltage and a gate connected to a bias voltage (BIAS P). The DAC bit circuit 650 may also include a first control PMOS transistor 660 having a source connected to a drain of the bias PMOS transistor 655, a gate connected to a decoder output corresponding to a decoded digital input, and a drain connected to NMOS transistor 665 and a first current mirror connected to circuit node 670. The DAC bit circuit 650 further includes a second control PMOS transistor 675 having a source connected to the drain of the bias PMOS transistor 655, a gate connected to a decoder output corresponding to a decoded complement of the digital input, and a drain connected to NMOS transistor 680 and a second current mirror connected to circuit node 685. While a particular arrangement of PMOS and NMOS transistors has been described with respect to FIGS. 6A and 6B, those of ordinary skill in the art will realize that complementary transistor types may be substituted as well (e.g., NMOS for PMOS, etc.).

Figure 7:
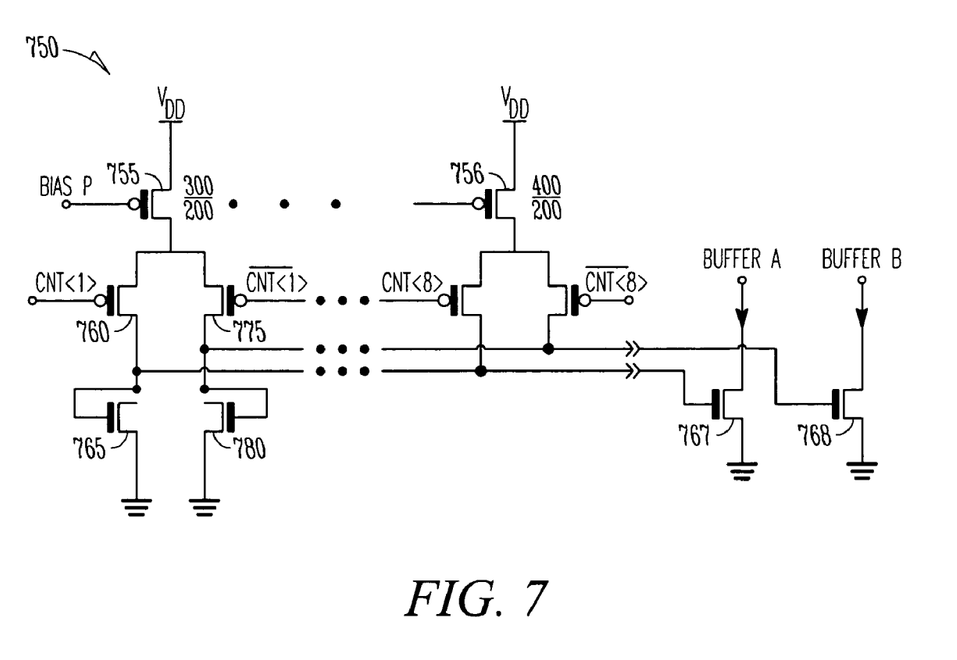
FIG. 7 is a schematic diagram of a DAC bit circuit connected to current mirrors, according to various embodiments of the invention.

FIG. 7 is a schematic diagram of a DAC bit circuit 750 connected to current mirror NMOS transistors 767, 768. When the control PMOS transistor 760 is on, current is sunk by NMOS transistor 765. The size of the current provided in each DAC bit circuit 750 is determined by the size of the bias PMOS transistor 755 and the gate bias BIAS P. To form a first current mirror, another NMOS transistor 767 may have its gate connected to the gate of NMOS transistor 765. Because of the gate connections, the currents contributed by the individual DAC bit circuits 750 that have turned control PMOS transistor 760 "ON" are sunk by NMOS transistor 765. This current is reflected in mirror NMOS transistor 767, which sets the bias current for buffer A.

To form a second current mirror, another NMOS transistor 768 may have its gate connected to the gate of NMOS transistor 780. The currents contributed by the individual DAC bit circuits 750 that have control PMOS transistor 775 "ON" are sunk by NMOS transistor 780. This current is reflected in mirror NMOS transistor 768, which sets the bias current for buffer B. Because the gates of the control PMOS transistors 760, 775 are connected to complement decodes, one of the control PMOS transistors 760, 775 may be ON while the other is OFF, reducing the amount of leakage current.

Turning now to FIG. 5, the digital input to the decoder may include seven bits and the DAC includes two sets of 128 current mirrors to provide currents of up to 128 times the current of a unit-sized current mirror. The decoder 565 in FIG. 5 can provide a decode output of the digital input to enable a first current mirrors in the DAC 540 to provide an output current of up to 128 times the current of a unit-sized current mirror. The decoder 565 may also provide a decode output according to the complement of the digital input to enable a second current mirror to provide an output current that is a complement value of the output current in the first set. In this way, the sum of the output currents of the DAC 540 comprises a substantially constant value and the clock phase output is proportional to the current steering of the output currents toward one or the other of the differential buffers 545, 546.

The phase interpolator circuit 500 may include a controller circuit 570. The controller circuit 570 may include logic circuitry to change the digital input 525 to the DAC 540 to sweep the clock phase of the output clock signal OUTCK. The digital input 525 may be incremented from 0 to 127 (big endian count) to interpolate the phase of the output clock between the 0° reference phase clock signal and the 45° reference phase clock signal. At a count of 127, the first differential buffer 545 may be given the least weight and the input to the first differential buffer 545 may be switched by the MUX to the 90° reference phase clock signal. In some embodiments, the MUX select bits 525 are sequentially changed to select the next reference phase clock signal. The controller circuit 570 may change the count to count from 127 to 0 (little endian count) to interpolate the phase of the output clock between the 45° reference phase clock signal and 90° reference phase clock signal. Thus, the decoding may include a big endian count for 0° to 45°, 90° to 135°, 180° to 225°, and 270° to 315°, and the decoding may include a little endian count for 45° to 90°, 135° to 180°, 225° to 270°, and 315° to 360°.

Figure 8:
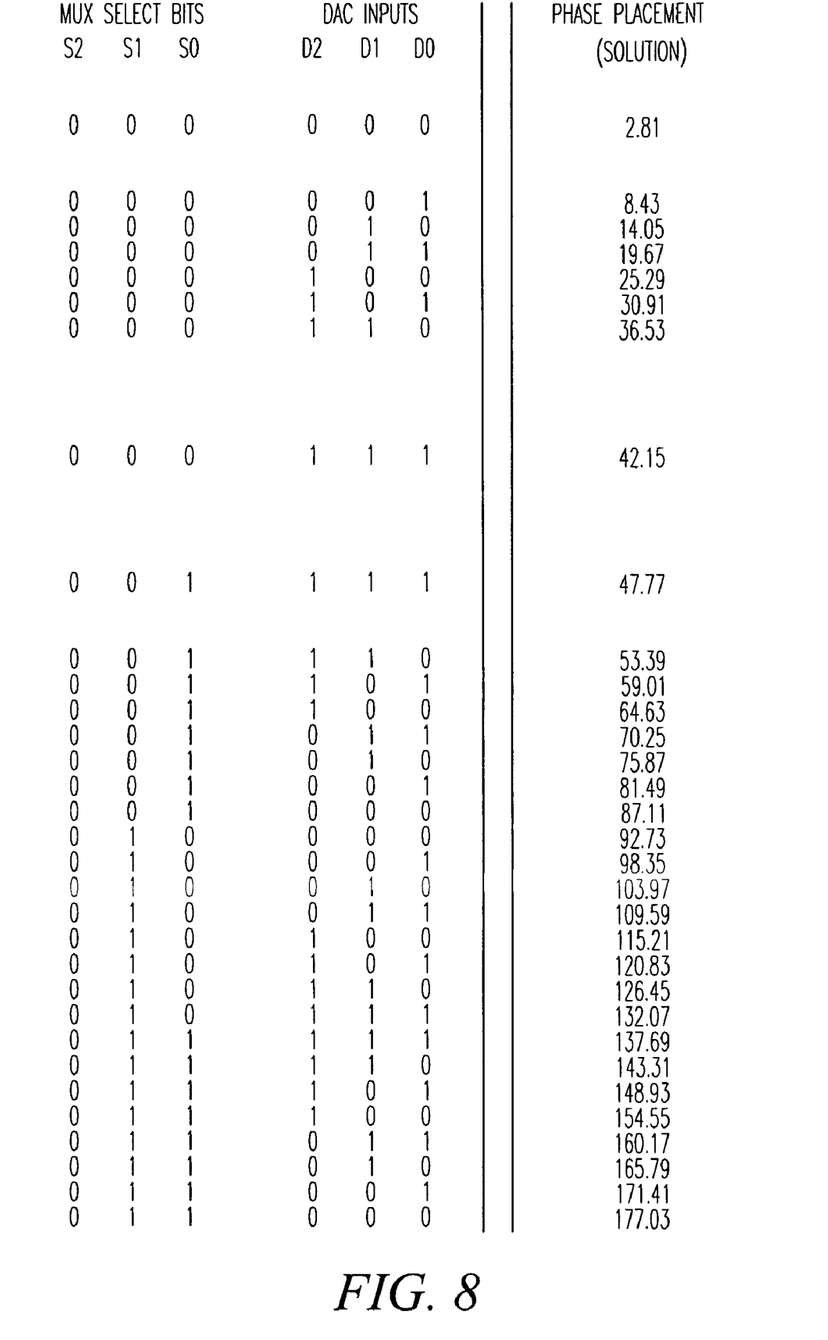
FIG. 8 is a table illustrating sweeping an output clock phase, according to various embodiments of the invention.

FIG. 8 is a table illustrating sweeping an output clock phase. Again, for simplicity, only a three-bit digital input for eight steps is shown instead of 128 or more steps that might be used. Only one count is needed by the DAC 540 to generate the two output currents. When the DAC digital input is at zero, corresponding to the case where the first differential buffer 545 is given the highest weight and the second differential buffer 546 is given the lowest weight, the interpolated phase of the output clock signal OUTCK is about 2.8° instead of 0°. This may be due to coupling capacitance between the two differential buffers 545, 546. When the count is at eight, corresponding to the case where the first differential buffer 545 is given the lowest weight and the second differential buffer 546 is given the highest weight, the interpolated phase at the output is about 42.2° instead of 45°. When the MUX select bits change from "000" o "001" to select the third reference clock having a phase of 90°, the interpolated phase at the output is about 47.8° instead of 45°.

It can be seen that the extra long step of FIG. 3 is not evident in FIG. 8, and the phase interpolated clock signal (OUTCK) changes phase monotonically when the count at the digital input changes from big to little endian count types. FIG. 8 also shows that the phase interpolated clock signal changes phase monotonically when the count at the digital input changes from little to big endian count types. It can also be seen that the phase interpolated clock signal sweeps monotonically through less than 45° of phase shift from a first count of an endian count type to a last count of the same endian count type (e.g., about 42.2° for the big endian count). It also sweeps monotonically through approximately 45° of phase shift from the first count of an endian count type to a first count of a different endian count type (e.g., about 47.8° from the first big endian count to the first little endian count).

As discussed previously, a DAC should have a transfer function that is a straight line. To implement such a transfer function, a step change in the digital input should cause a uniform step change in output current. According to some embodiments, the phase interpolator circuit 500 is included in an integrated circuit (IC) package 502. To promote matching among the current mirrors 542, 543 and thereby reduce INL error, the transistors of the current mirrors 542, 543 may be multiples of a unit-sized transistor. To further promote matching, the current mirrors 542, 543 may be arranged in an interdigitated layout fashion. This means that transistors of the first set of mirrors are uniformly laid out and alternately connected as either part of the first current mirror or part of the second current mirror. This is illustrated in FIG. 9.

Figure 9:
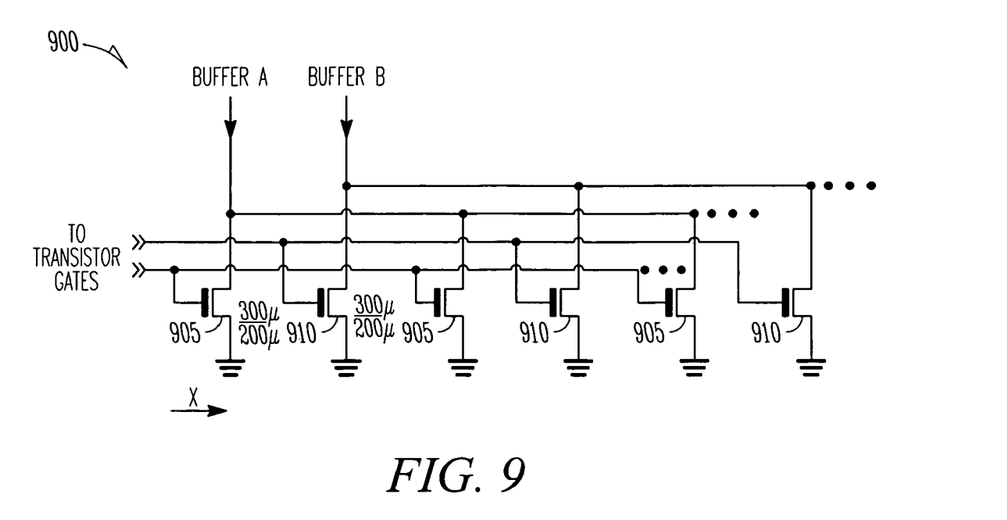
FIG. 9 is a schematic diagram of a portion of a circuit to implement current mirrors, according to various embodiments of the invention.

FIG. 9 is a schematic diagram of a portion of a circuit 900 to implement the current mirrors 542, 543. Unit sized NMOS transistors 905 may be included in a current mirror for a first buffer, buffer A, and unit sized NMOS transistors 910 may be included in a current mirror for a second buffer, buffer B. The unit sized transistors 905, 910 may have a width of 300μ and a length of 200μ. The transistors are laid-out in an alternating fashion with transistors 905 comprising the first current mirror and transistors 910 comprising the second current mirror. Interdigitating is done so that any variation in the X or Y direction of integrated circuit parameters is imparted to legs of both sets of current mirrors. In some embodiments, the interdigitating is only in one direction on the integrated circuit (such as the X direction) instead of two directions to further promote matching.

Turning now to FIG. 7, current mirror transistors 767, 768 can be implemented using unit-sized transistors as in FIG. 9. FIG. 9 shows a simplified case of three transistors 905 implementing current mirror transistor 767 and three transistors 910 implementing current mirror transistor 768 although any multiple may be used. NMOS transistors 765, 780 may also be implemented using unit-sized transistors. Current matching is further promoted by interdigitating transistors 765, 780, 767, and 768.

According to some embodiments, the bias PMOS transistors 755 of the DAC bit circuit 750 are specifically sized to reduce INL error. This can be referred to as "contouring" the DAC bits. The size of the current provided in each DAC bit circuit 750 is determined in part by the size of the bias PMOS transistor 755. Thus, instead of all bias PMOS transistors 755 being a copy of a same-sized transistor, at least one of the bias PMOS transistors 755 is made to be a different size to reduce INL error of the DAC. For example, bias PMOS transistor 755 represents part of a DAC bit circuit at position "1" in a DAC, and bias PMOS transistor 756 represents part of a DAC bit circuit at position "8" in a DAC. The width to length ratio (W/L) of bias PMOS transistor 755 is 300 microns (μ) to 200μ, while the width to length ratio of bias PMOS transistor 756 is 400μ to 200μ.

In an illustrative example using a 7-to-128 bit DAC, the unit sized bias PMOS transistor of the DAC bit has dimensions of width to length ratio (W/L) of 300μ to 200μ. The remaining bias PMOS transistors (127) are divided into fifteen groups of eight DAC bits and one group of seven. The sizes of the bias PMOS transistors are contoured to reduce the amount of INL in a DAC. At least one group has transistors of a different size than transistors of another group. An example of contoured DAC bit sizes to reduce INL error in a 7-to-128 bit DAC is shown in Table 1.

TABLE 1

| DAC Bit Position of the Group | Size (W/L) in microns |
| --- | --- |
| 1:8 | 300/200 |
| 9:16 | 400/200 |
| 17:24 | 300/200 |
| 25:32 | 300/200 |
| 33:40 | 300/200 |
| 41:48 | 350/200 |
| 49:56 | 300/200 |
| 57:64 | 300/200 |
| 65:72 | 500/200 |
| 73:80 | 300/200 |
| 81:88 | 600/200 |
| 89:96 | 550/200 |
| 97:104 | 300/200 |
| 105:112 | 450/200 |
| 113:120 | 300/200 |
| 121:127 | 300/200 |

Figure 10:
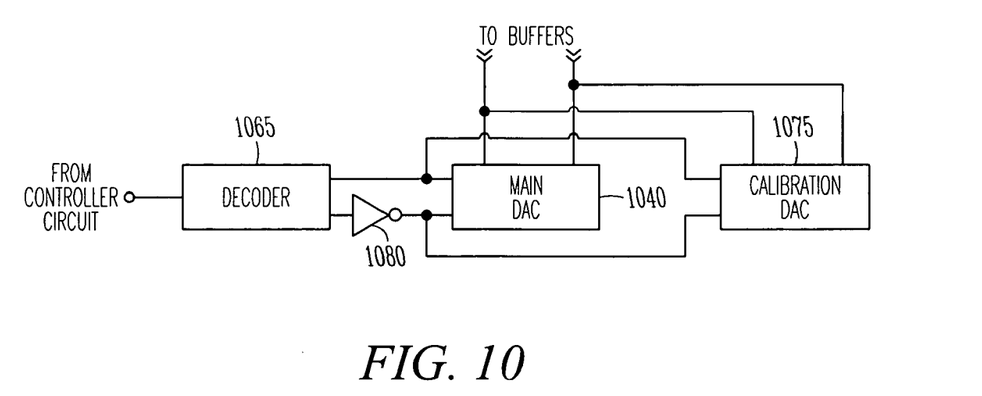
FIG. 10 is a block diagram illustrating a second DAC placed in parallel with a main DAC, according to various embodiments of the invention.

FIG. 10 is a block diagram illustrating a second DAC placed in parallel with a main DAC. To provide further reduction of INL error in a test lab application, the phase interpolator circuit may include a second DAC placed in parallel with the main DAC 1040 to calibrate the weighting currents. The calibration DAC 1075 may have the same number of bits as the main DAC 1040, and the Bias PMOS transistors may provide a smaller current to fine tune the weighting currents. The current in a DAC bit of the calibration DAC 1075 can be set by adjusting the bias (BIAS P) at the gate of the Bias PMOS transistors and/or adjusting the W/L ratio of the Bias PMOS transistors. The calibration DAC 1075 may use the same decoding and complement decoding 1080 from decoder 1065 as the main DAC 1040. However, individual combinations of banks can be selectively turned on or off to add or subtract from the weighting output currents determined by the main DAC 1040. For example, if the main DAC 1040 includes 128 bits, the calibration DAC 1075 may have combinations of eight-bit banks, any one of which can be turned on or off to change the weighting currents and reduce INL error. The eight-bit banks of the calibration DAC 1075 may be configured only one time via lab analysis of the phase interpolator circuit.

Figure 11:
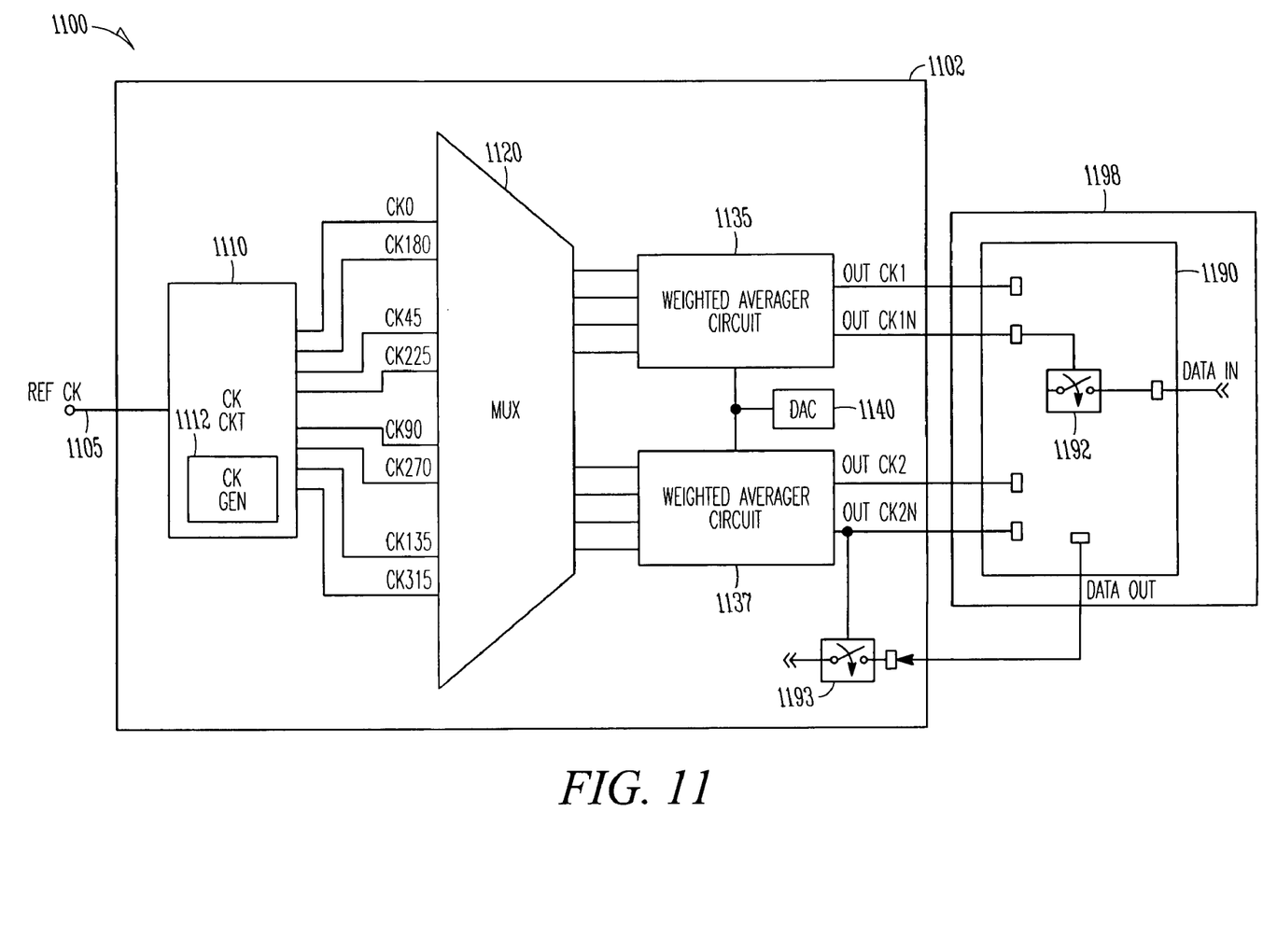
FIG. 11 shows a block diagram of portions of a phase interpolator circuit, according to various embodiments of the invention.

FIG. 11 shows a block diagram of portions of a phase interpolator circuit 1100. In some embodiments, the phase interpolator circuit 1100 is included in an IC package 1102. The phase interpolator circuit 1100 includes a DAC and two weighted averager circuits 1135, 1137. The two weighted averager circuits 1135, 1137 each may include two differential buffers (not shown, but similar to or identical to those shown in FIGS. 2 and 5). The DAC 1140 receives a single digital input and provides four currents to bias the output drive of four differential buffers. Still using the 7-to-128 bit example, the DAC 1140 may operate to convert a 7-bit digital input to 128 levels of current. A MUX 1120 receives a set of eight reference phase clock signals CK0, CK180, CK45, CK225, CK90, CK270, CK135, and CK 315. The reference phase clock signals may be generated from a reference clock signal 1105 using clock circuit 1110 and clock generator 1112. Two phase interpolated output clock signals OUTCK1, OUTCK2 may be generated from the reference phase clock signals. The phase interpolator circuit 1100 may use the reference phase clock signals to sweep the phase of the output clocks through 1024 sub-phase intervals. This can be extended to include multiple phase interpolator circuits 1100 providing multiple interpolated output clock signals. Multiple clock signals can be useful for clock sweeping multiple clock signals in IC test structures, such as for testing high speed memory ICs.

In some embodiments, the phase interpolator circuit 1100, which may form part of an IC package 1102, may be used to sweep the phase of one or more output clock signals usable by an IC under test 1190. The IC under test 1190 may be attached to a test fixture 1198, and may use one or more of the output clock signals OUTCK1, OUTCK2 provided by the weighted averager circuit 1135 for sampling received data using sampling circuit 1192. The phase interpolator circuit 1100 may also be used to sweep the phase of an output clock signal used by sampling circuit 1193 to sample data sent from the IC under test 1190. In some systems, the reference clock signal 1105 used to generate the reference phase clock signals is in the range of approximately 0.8 gigahertz (GHz) to 1.6 GHz. Using a reference clock signal 1105 of 1.2 GHz results in a phase step size of approximately 814 femtoseconds (fs).

Figure 12:
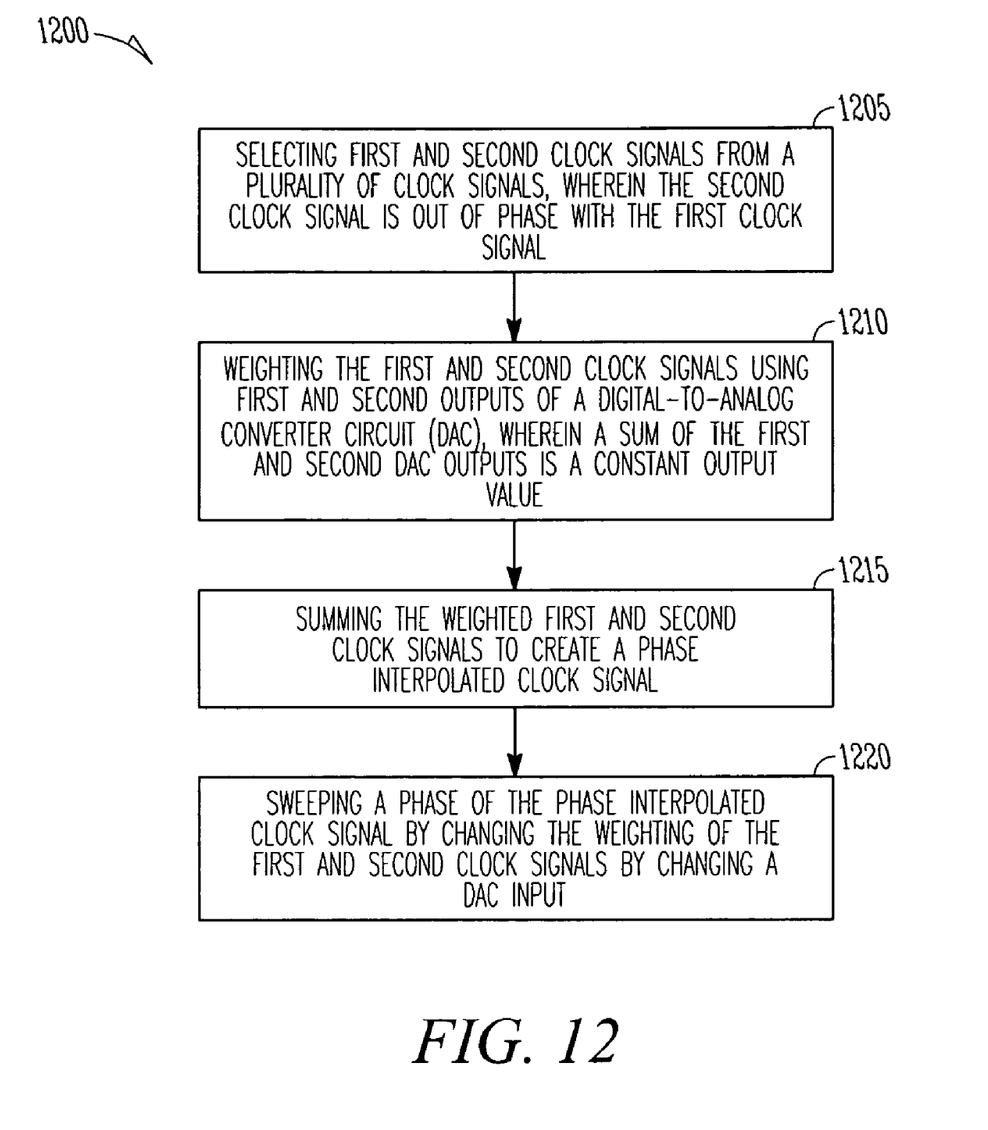
FIG. 12 is a flow diagram of a method of interpolating the phase of a clock signal, according to various embodiments of the invention.

FIG. 12 is a flow diagram of a method 1200 of interpolating the phase of a clock signal. At block 1205, first and second clock signals may be selected from a plurality of clock signals, wherein the second clock signal is out of phase with the first clock signal. In some embodiments, the second clock signal is forty-five degrees out of phase with the second clock signal. In some embodiments, the first and second clock signals are selected from a plurality of reference phase clock signals using a MUX. The reference phase clock signals may be generated using a clock circuit, such as a PLL or a DLL. In some embodiments, the reference phase clock signals include eight reference phase clock phases substantially evenly spaced from 0° to 360°, and the first and second reference phase clock signals may be selected sequentially from among the eight reference phase clock signals.

At block 1210, the first and second clock signals that have been selected may be weighted using first and second outputs of a digital-to-analog converter circuit (DAC). The sum of the first and second DAC outputs may be a substantially constant output value. In some embodiments, the DAC outputs are current outputs and the sum of the first and second DAC current outputs is a substantially constant value of current.

At block 1215, the weighted first and second clock signals may be summed to create a phase interpolated clock signal. In some embodiments, the first and second clock signals are weighted by receiving the first and second clock signals into first and second buffers, respectively, and the first and second DAC outputs may be used to weight the output of the first and second buffers, respectively.

At block 1220, the phase interpolated clock signal phase may be swept through a plurality of phase values by changing the weighting of the first and second clock signals, which may be accomplished in some embodiments by changing the DAC input digital value. In some cases, the DAC converts a 7-bit digital input to 128 levels of current. Eight reference phase clock signals may be sequentially weighted by the DAC and summed to sweep the phase of an output clock through 1024 sub-phase intervals.

In some embodiments, the DAC input is changed by alternating the digital input between big endian counting and little endian counting when a new pair of clock signals is selected for combination. The method 1200 may include monotonically changing the clock phase of the phase interpolated clock signal when the digital input changes between big and little endian counting. In some embodiments, weighting the clock signals received by the buffers includes tri-stating either the output of the first buffer or the output of the second buffer when the end of a big endian count or a little endian count is reached. In some embodiments, the first and second clock signals are weighted using outputs from a single main DAC and outputs from a calibration DAC connected in parallel with the main DAC. In some embodiments, the main DAC outputs are current outputs and the calibration DAC adds or subtracts current from the main DAC current outputs.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations, or variations, or combinations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own.

What is claimed is:

1. A phase interpolator circuit comprising:
    a multiplexer circuit (MUX) to receive a plurality of clock signals at a corresponding plurality of MUX inputs and to output a first clock signal and a second clock signal that are out of phase with each other;
    a digital to analog converter circuit (DAC) to convert a digital input to first and second DAC output currents such that a sum of the first and second DAC output currents is a substantially constant current value, wherein the first clock signal is to be weighted according to the first DAC output current and the second clock signal is to be weighted according to the second DAC output current; and
    a weighted averager circuit coupled to the MUX and the DAC, wherein the weighted averager circuit is to sum weighted first and second clock signals to output a phase interpolated clock signal.

2. The phase interpolator circuit of claim 1, further including:
    a controller circuit coupled to the DAC, wherein the controller circuit includes logic circuitry to alternate the DAC digital input between a big endian count type and a little endian count type when a different clock signal pair is output by the MUX, and wherein a clock phase of the phase interpolated clock signal changes monotonically when the count at the digital input changes between endian count types.

3. The phase interpolator circuit of claim 2, wherein the MUX includes select inputs coupled to the controller circuit, the controller circuit to select the first and second clock signals sequentially as a pair from among the plurality of clock signals, and wherein a clock phase of the phase interpolated clock signal changes monotonically when the controller circuit selects a different pair of clock signals.

4. The phase interpolator circuit of claim 2, wherein the second clock signal is forty-five degrees out of phase with the first clock signal, and wherein the phase interpolated clock signal sweeps monotonically through less than forty-five degrees of phase shift from a first count of an endian count type to a last count of the same endian count type, and sweeps monotonically through approximately forty-five degrees of phase shift from the first count of an endian count type to a first count of a different endian count type.

5. The phase interpolator circuit of claim 1, wherein the weighted averager circuit includes:
   a first buffer to receive the first clock signal;
   a second buffer to receive the second clock signal, wherein the first DAC output current adjusts an output drive of the first buffer to weight the first clock signal and the second DAC output current adjusts an output drive of the second buffer to weight the second clock signal; and
   a summing node to combine outputs of the first and second buffer and produce the phase interpolated clock signal.

6. The phase interpolator circuit of claim 5, wherein at least one of the first buffer and the second buffer includes a tri-state circuit coupled to a buffer output to tri-state the buffer output when a DAC output current turns the at least one of the first buffer and the second buffer off.

7. The phase interpolator circuit of claim 1, wherein the DAC includes a first current mirror to size the first DAC output current and a second current mirror to size the second DAC output current.

8. An integrated circuit package, comprising:
   a multiplexer circuit (MUX) to receive a plurality of clock signals and to output a first and a second clock signal that are out of phase with each other;
   a main digital to analog converter circuit (DAC) to convert a digital input to first and second DAC output currents such that a sum of the first and second DAC output currents is a constant current value;
   a calibration DAC coupled to the main DAC such that an output of the calibration DAC adjusts the first and second DAC output currents, wherein the first clock signal is to be weighted according to the first DAC output current and the second clock signal is to be weighted according to the second DAC output current; and
   a weighted averager circuit coupled to the MUX and the main DAC, wherein the weighted averager circuit is to sum weighted first and second clock signals to output a phase interpolated clock signal.

9. The integrated circuit package of claim 8, further including:
   a logic circuit coupled to the DAC digital input, the logic circuit to alternate the DAC digital input between a big endian count type and a little endian count type when a different clock signal pair is output by the MUX, and wherein a clock phase of the phase interpolated clock signal changes monotonically when the digital input changes between endian Count types.

10. The integrated circuit package of claim 8, wherein the DAC includes:
   a first current mirror to size the first DAC output current and a second current mirror to size the second DAC output current, and wherein the DAC includes a decoder to provide an output to select a first DAC output current level according to a decoded digital input and to provide an output to select a second DAC output current level according to a decoded complement of the digital input.

11. The integrated circuit package of claim 10, wherein each decoder output is connected to a DAC bit circuit that includes:
   a bias PMOS transistor having a source connected to a supply voltage and a gate connected to a bias voltage;
   a first control PMOS transistor having a source connected to a drain of the bias PMOS transistor, a gate connected to a decoder output corresponding to a decoded digital input, and a drain connected to the first current mirror; and
   a second control PMOS transistor having a source connected to the drain of the bias PMOS transistor, a gate connected to a decoder output corresponding to a decoded complement of the digital input, and a drain connected to the second current mirror.

12. The integrated circuit package of claim 11, wherein the DAC bit circuits are divided into groups of like bias PMOS transistor sizes, wherein at least one group includes bias PMOS transistors of a different size than bias PMOS transistors of another group, and wherein the bias PMOS transistors in DAC bit circuit groups are sized to reduce integral non-linearity (INL) error of the DAC.

13. A method comprising:
   selecting first and second clock signals from a plurality of clock signals, wherein the second clock signal is out of phase with the first clock signal;
   weighting the first and second clock signals using first and second outputs of a digital-to-analog converter circuit (DAC), wherein a sum of the first and second DAC outputs is a substantially constant output value;
   summing the weighted first and second clock signals to create a phase interpolated clock signal; and
   sweeping a phase of the phase interpolated clock signal by changing the weighting of the first and second clock signals by changing an input of the DAC.

14. The method of claim 13, wherein selecting includes:
   selecting the first and second clock signals sequentially as a pair from among a plurality of clock signals, the first clock signal in the pair being forty-five degrees out of phase with the second clock signal in the pair, wherein changing the input includes alternating between big endian counting and little endian counting at the input when a different pair of clock signals is selected; and
   monotonically changing the clock phase of the phase interpolated clock signal when the input changes between the big endian counting and the little endian counting.

15. The method of claim 14, wherein weighting includes:
   receiving the first clock signal at a first buffer and receiving the second clock signal at a second buffer;
   weighting outputs of the buffers using the first and second DAC outputs; and
   tri-stating either an output of the first buffer or an output of the second buffer when an end of a big endian count or a little endian count is reached.

16. The method of claim 13, wherein the DAC is a main DAC, and wherein weighting includes:
   calibrating the first and second outputs of the main DAC using a calibration DAC.

17. A system comprising:
   a clock circuit to generate a plurality of reference phase clock signals from an input clock signal, the plurality of reference phase clock signals out of phase with each other and having phase shifts evenly spaced within a range of zero to 360 degrees; and
   at least one phase interpolator circuit coupled to the clock circuit, the phase interpolator circuit including:
      a multiplexer circuit (MUX) to receive the plurality of clock signals at MUX inputs and to output a first and a second clock signal that are out of phase with each other;
      a digital to analog converter circuit (DAC) to convert a digital input to first and second DAC output currents such that a sum of the first and second DAC output currents is a substantially constant current value; and
      at least one weighted averager circuit coupled to the MUX and the DAC, wherein the weighted averager circuit is to sum weighted first and second clock signals to output a phase interpolated clock signal, and wherein the first clock signal is weighted according to the first DAC output current and the second clock signal is weighted according to the second DAC output current.

18. The system of claim 17, wherein the phase interpolator circuit includes a logic circuit coupled to the digital input of the DAC, wherein the logic circuit is to alternate the digital input of the DAC between a big endian count type and a little endian count type when a different clock signal pair is output by the MUX, and wherein a clock phase of the phase interpolated clock signal changes monotonically when the count at the digital input changes between endian count types.

19. The system of claim 17, wherein the clock circuit includes a phase locked loop circuit (PLL).

20. The system of claim 17, wherein the clock circuit includes a delay locked loop circuit (DLL).

21. The system of claim 17, wherein the weighted averager circuit provides an output clock signal to an integrated circuit under test, the output clock signal having a phase changeable from zero to 360 degrees.

22. The system of claim 17, wherein the phase interpolator circuit communicates multiple clock signals to a receiving integrated circuit under test, wherein at least one of the clock signals is usable by the receiving integrated circuit for data sampling.

23. The system of claim 17, including:
at least one phase interpolator circuit to generate an output clock signal to sample a data signal communicated from an integrated circuit under test.

24. The system of claim 17, including:
a test fixture to attach to an integrated circuit under test, the test fixture to receive the phase interpolated clock signal.

* * * * *

UNITED STATES PATENT AND TRADEMARK OFFICE
CERTIFICATE OF CORRECTION

| | | |
|---|---|---|
| PATENT NO. | : 7,532,053 B2 | Page 1 of 1 |
| APPLICATION NO. | : 11/649434 | |
| DATED | : May 12, 2009 | |
| INVENTOR(S) | : Rausch | |

It is certified that error appears in the above-identified patent and that said Letters Patent is hereby corrected as shown below:

In column 11, line 46, in Claim 9, delete "Count" and insert -- count --, therefor.

Signed and Sealed this

Twenty-first Day of July, 2009

JOHN DOLL
*Acting Director of the United States Patent and Trademark Office*